(12) United States Patent
Yang et al.

(10) Patent No.: US 9,064,939 B2
(45) Date of Patent: Jun. 23, 2015

(54) METHODS OF MAKING INTEGRATED CIRCUITS

(71) Applicant: TAIWAN SEMICONDUCTOR MANUFACTURING COMPANY, LTD., Hsinchu (TW)

(72) Inventors: Chung-Ying Yang, Taoyuan (TW); Hsien-Wei Chen, Sinying (TW)

(73) Assignee: TAIWAN SEMICONDUCTOR MANUFACTURING COMPANY, LTD. (TW)

( * ) Notice: Subject to any disclaimer, the term of this patent is extended or adjusted under 35 U.S.C. 154(b) by 0 days.

(21) Appl. No.: 14/322,122

(22) Filed: Jul. 2, 2014

(65) Prior Publication Data

US 2014/0315383 A1  Oct. 23, 2014

Related U.S. Application Data

(63) Continuation of application No. 13/219,369, filed on Aug. 26, 2011, now Pat. No. 8,796,686.

(51) Int. Cl.
*H01L 21/66*  (2006.01)
*H01L 21/768*  (2006.01)
*H01L 23/58*  (2006.01)
*H01L 23/00*  (2006.01)

(52) U.S. Cl.
CPC .......... *H01L 21/76895* (2013.01); *H01L 22/34* (2013.01); *H01L 23/585* (2013.01); *H01L 23/564* (2013.01); *H01L 2924/0002* (2013.01); *H01L 22/32* (2013.01)

(58) Field of Classification Search
CPC ...................................................... H01L 22/34
USPC ......... 438/14, 15, 18; 257/E23.019, E23.142, 257/127, 170, 409, 452, 484, 605
See application file for complete search history.

(56) References Cited

U.S. PATENT DOCUMENTS

| | | | |
|---|---|---|---|
| 7,397,103 B2 * | 7/2008 | Archer et al. | 257/484 |
| 2003/0151047 A1 | 8/2003 | Corbett et al. | |
| 2007/0069365 A1 | 3/2007 | Archer et al. | |
| 2007/0267631 A1 | 11/2007 | Weiner et al. | |

FOREIGN PATENT DOCUMENTS

CN   1941366   4/2007

* cited by examiner

*Primary Examiner* — Julia Slutsker
(74) *Attorney, Agent, or Firm* — Lowe Hauptman & Ham, LLP

(57) ABSTRACT

A method of making an integrated circuit including forming a seal ring structure around a circuit where the seal ring structure has a first portion and a tilted portion. The first portion of the seal ring structure is substantially parallel with an edge of the circuit. The tilted portion of the seal ring structure forms an obtuse angle with the first portion. The method further includes forming a first pad which is electrically coupled with the seal ring structure. The method further includes disposing a leakage current test structure in an area enclosed by the seal ring where at least one portion of the leakage current test structure is substantially parallel with the tilted portion of the seal ring structure. The method further includes forming a second pad which is electrically coupled with the leakage current test structure.

20 Claims, 4 Drawing Sheets

METHODS OF MAKING INTEGRATED CIRCUITS

PRIORITY CLAIM

The present application is a continuation of U.S. application Ser. No. 13/219,369, filed Aug. 26, 2011, the disclosure of which is incorporated herein by reference in its entirety.

TECHNICAL FIELD

The present disclosure relates generally to the field of semiconductor package systems and, more particularly, to methods of making integrated circuits.

BACKGROUND OF THE DISCLOSURE

In electronics, an integrated circuit (IC) is a miniaturized electronic circuit (including semiconductor devices, as well as passive components) that has been manufactured in the surface of a thin substrate of semiconductor material. In general, integrated circuits are fabricated simultaneously in multiples on a wafer. The wafer is sawed into individual chips once the fabrication is complete.

Conventionally, the uppermost surfaces of the chips are generally protected by the deposition of a passivation structure. However, this passivation structure cannot cover the periphery of each chip. Thus, the periphery of each sawed chip is exposed to moisture and ionic contaminants. Accordingly, "seal rings," also known as "guard rings," generally are formed of at least one metal band around at least the upper periphery of each chip as part of the fabrication of the IC dice prior to sawing the wafer. The seal rings can provide structural reinforcement and stop moisture and mobile ionic contaminants from entering chip active circuitry regions and affecting operational reliability.

BRIEF DESCRIPTION OF THE DRAWINGS

The present disclosure is best understood from the following detailed description when read with the accompanying figures. It is emphasized that, in accordance with the standard practice in the industry, various features are not drawn to scale and are used for illustration purposes only. In fact, the numbers and dimensions of the various features may be arbitrarily increased or reduced for clarity of discussion.

DETAILED DESCRIPTION OF THE DISCLOSURE

Figure 1A:
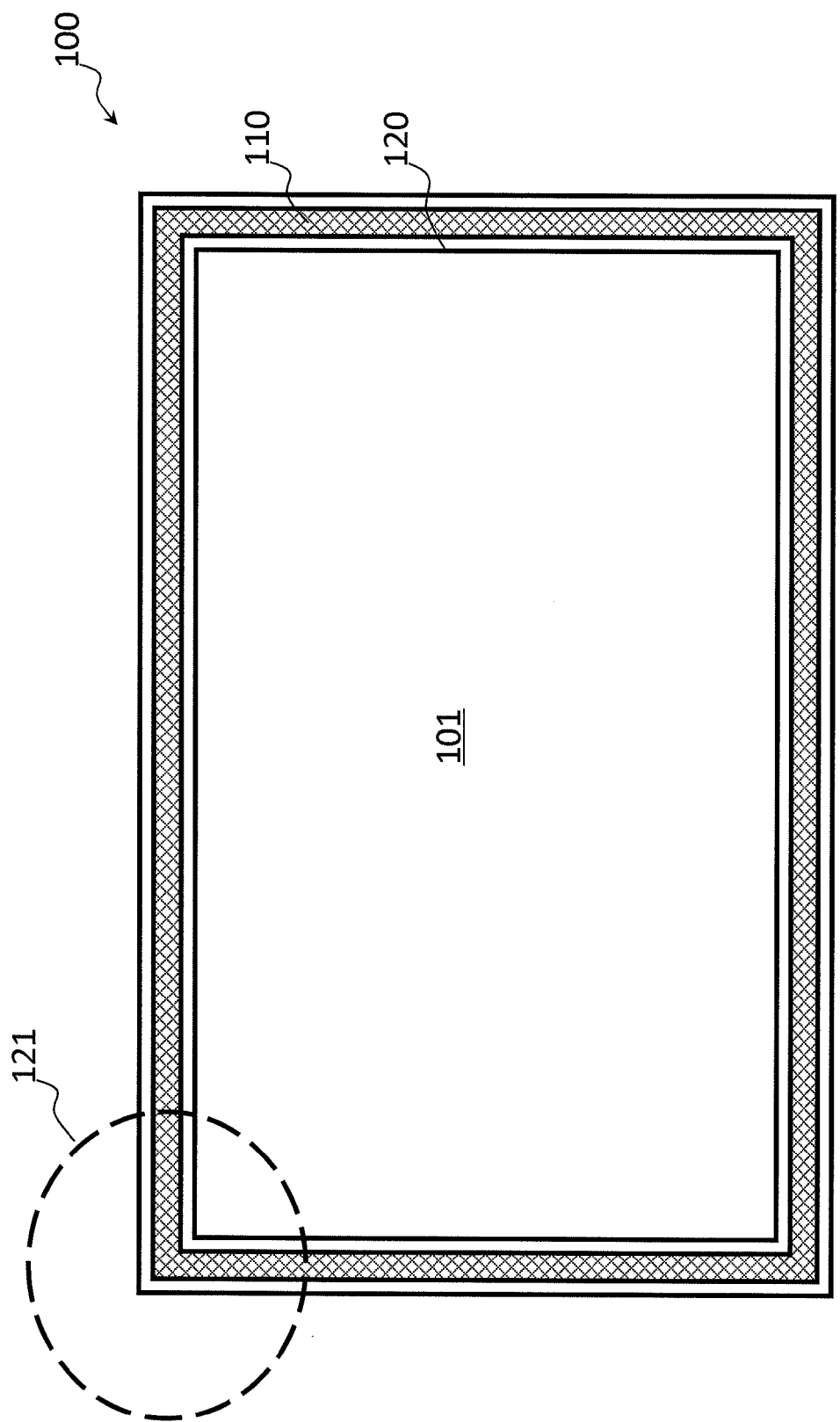
FIG. 1A is a schematic top view of an exemplary integrated circuit.

As noted, seal rings are configured to provide structural reinforcement and stop moisture and mobile ionic contaminants from entering chip active circuitry regions and affecting operational reliability. Applicants find that minor cracks and/or damage may occur to extra-low dielectric constant (ELK) layers that are adjacent to the seal rings. The minor cracks and/or damage may not affect the physical structure of the seal rings and may not be observed under microscopes. However, the minor cracks and/or damage may provide leakage paths between the seal rings and circuits that are disposed close to the seal rings. Leakage currents may flow between the seal rings and the circuits through the minor cracks and damage, consuming the power of the circuits.

It is understood that the following disclosure provides many different embodiments, or examples, for implementing different features of the application. Specific examples of components and arrangements are described below to simplify the present disclosure. These are, of course, merely examples and are not intended to be limiting. In addition, the present disclosure may repeat reference numerals and/or letters in the various examples. This repetition is for the purpose of simplicity and clarity and does not in itself dictate a relationship between the various embodiments and/or configurations discussed. Moreover, the formation of a feature on, connected to, and/or coupled to another feature in the present disclosure that follows may include embodiments in which the features are formed in direct contact, and may also include embodiments in which additional features may be formed interposing the features, such that the features may not be in direct contact. In addition, spatially relative terms, for example, "lower," "upper," "horizontal," "vertical," "above," "below," "up," "down," "top," "bottom," etc. as well as derivatives thereof (e.g., "horizontally," "downwardly," "upwardly," etc.) are used for ease of the present disclosure of one features relationship to another feature. The spatially relative terms are intended to cover different orientations of the device including the features.

FIG. 1A is a schematic top view of an exemplary integrated circuit. In FIG. 1A, an integrated circuit 100 includes a seal ring structure 110 that is disposed around a circuit 120, which is disposed over a substrate 101. The seal ring structure 110 is configured to provide structural reinforcement to and stop moisture and/or mobile ionic contaminants from the circuit 120. As shown in FIG. 1A, the integrated circuit 100 includes four corners, one on which is a corner 121.

In some embodiments, the substrate 101 may include an elementary semiconductor including silicon or germanium in crystal, polycrystalline, or an amorphous structure; a compound semiconductor including silicon carbide, gallium arsenic, gallium phosphide, indium phosphide, indium arsenide, and/or indium antimonide; an alloy semiconductor including SeGe, GaAsP, AlInAs, AlGaAs, GaInAs, GaInP, and/or GaInAsP; any other suitable material; or combinations thereof. In at least one embodiment, the alloy semiconductor substrate may have a gradient SiGe feature in which the Si and Ge composition change from one ratio at one location to another ratio at another location of the gradient SiGe feature. In another embodiment, the alloy SiGe is formed over a silicon substrate. In another embodiment, a SiGe substrate is strained. Furthermore, the semiconductor substrate may be a semiconductor on insulator, such as a silicon on insulator (SOI), or a thin film transistor (TFT). In some examples, the semiconductor substrate may include a doped epitaxial (epi) layer or a buried layer. In other examples, the compound semiconductor substrate may have a multilayer structure, or the substrate may include a multilayer compound semiconductor structure.

In some embodiments, the circuit 120 can include circuitry, such as a memory circuit, e.g., a dynamic random access memory (DRAM) circuit, a static random access memory (SRAM) circuit, a non-volatile memory circuit and/or other memory circuits, a mixed-signal circuit, a signal processing circuit, a logic circuit, an analog circuit, other circuits, and/or any combinations thereof. It is noted that through merely showing a circuit block in FIG. 1A, the scope of the application is not limited thereto. In some embodiments, the circuit 120 includes at least one circuitry segment, e.g., a logic circuit segment and a memory circuit segment. The logic circuit segment and the memory circuit segment are electrically coupled with each other.

In some embodiments, the seal ring structure 110 can be made of at least one material, such as copper (Cu), aluminum (Al), aluminum copper (AlCu), aluminum silicon copper (AlSiCu), tungsten, titanium, tantalum, titanium nitride, tantalum nitride, nickel silicide, cobalt silicide, other proper conductive materials, and/or combinations thereof. It is noted that through merely showing a single seal ring in FIG. 1A, the scope of the application is not limited thereto. In some embodiments, two or more rings can be disposed around the circuit 120.

Figure 1B:
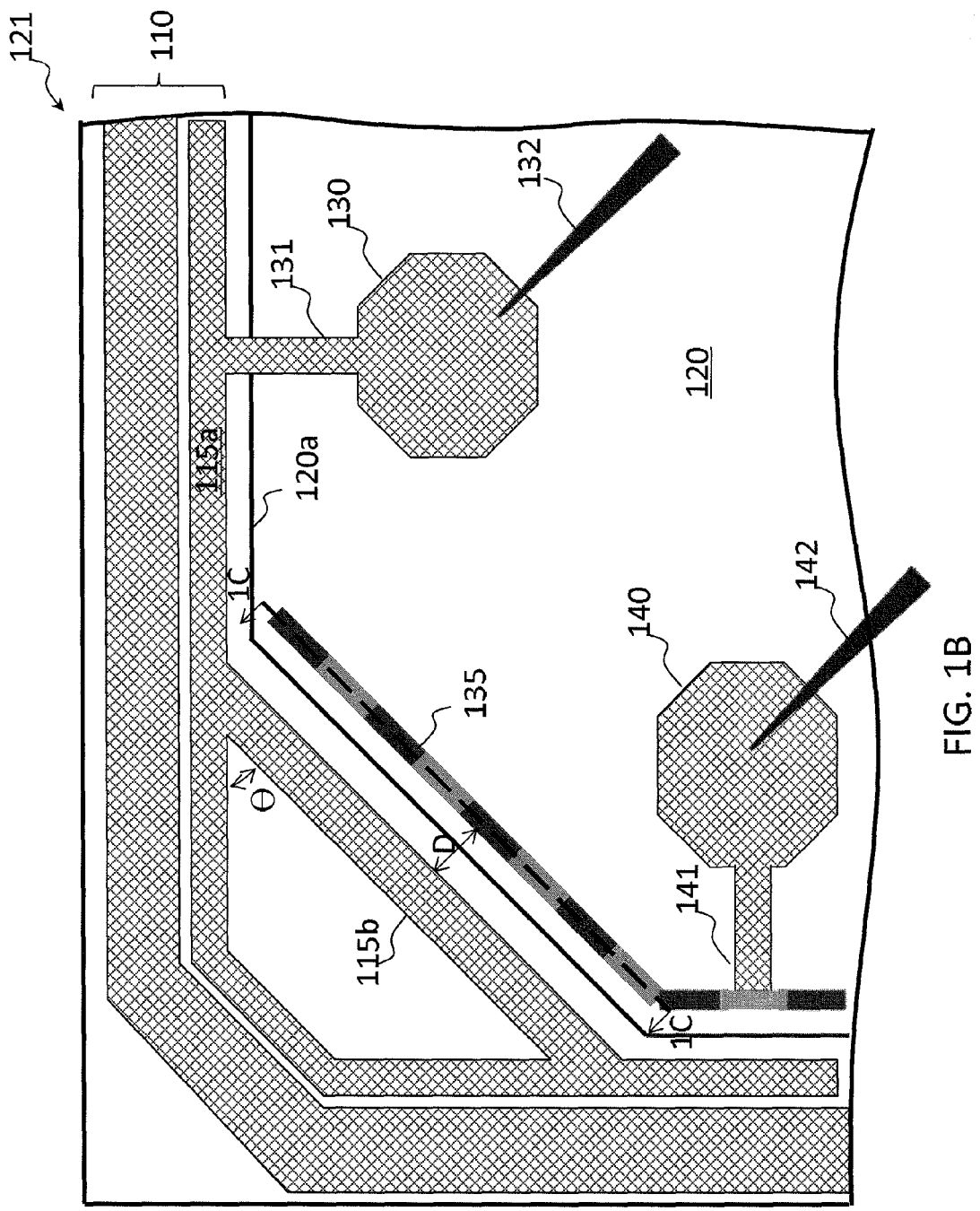
FIG. 1B is a schematic drawing illustrating a magnified corner of an exemplary integrated circuit.

FIG. 1B is a schematic drawing illustrating a magnified corner of an exemplary integrated circuit. In FIG. 1B, in the corner 121 of the integrated circuit 100, a pad 130 is electrically coupled with the seal ring structure 110. The integrated circuit 100 includes a leakage current test structure 135 that is adjacent to the seal ring structure 110. The integrated circuit 100 includes a pad 140 that is electrically coupled with the leakage current test structure 135. The leakage current test structure 135 and the pads 130, 140 are configured to provide a leakage current test between the seal ring structure 110 and the leakage current test structure 135.

Referring again to FIG. 1B, in some embodiments the pads 130 and 140 are electrically coupled with the seal ring structure 110 and the leakage current test structure 135 through conductive lines 131 and 141, respectively. In some embodiments, the conductive lines 131 and 141 can each be disposed in at least one metal layer of an interconnect structure of the circuit 120. In other embodiments, the conductive lines 131 and 141 can be disposed in the metal layer in which the pads 130 and 140 are disposed.

In some embodiments, the pads 130 and 140 each can be made of at least one material, such as Cu, Al, AlCu, AlSiCu, other metallic materials, and/or any combinations thereof. In some embodiments, the pads 130 and 140 each can include an under bump metallization (UBM) layer.

In some embodiments, the leakage current test structure 135 is disposed adjacent to the corner 121 of the integrated circuit 100. The seal ring structure 110 has portions 115a and 115b. The portion 115a is substantially parallel with an edge 120a of the circuit 120. The portion 115b is tilted from the portion 115a with an angle θ. In some embodiments, the angle θ can be of about 45 degrees. It is noted that the angle θ is merely exemplary. In other embodiments, the angle θ can be larger or smaller than 45 degrees.

In some embodiments, at least one portion of the leakage current test structure 135 is substantially parallel with the portion 115b as shown in FIG. 1B. The at least portion of the conductive structure 135 is separated from the portion 115b by a distance D. In some embodiments, the distance D is about 3 µm or less. Leakage currents that may occur within the range of the distance D can be probed. It is noted that the distance D is merely exemplary. The distance D may vary depending on the evolution of technology nodes. In some embodiments, the distance D is larger than 3 µm.

Figure 1C:
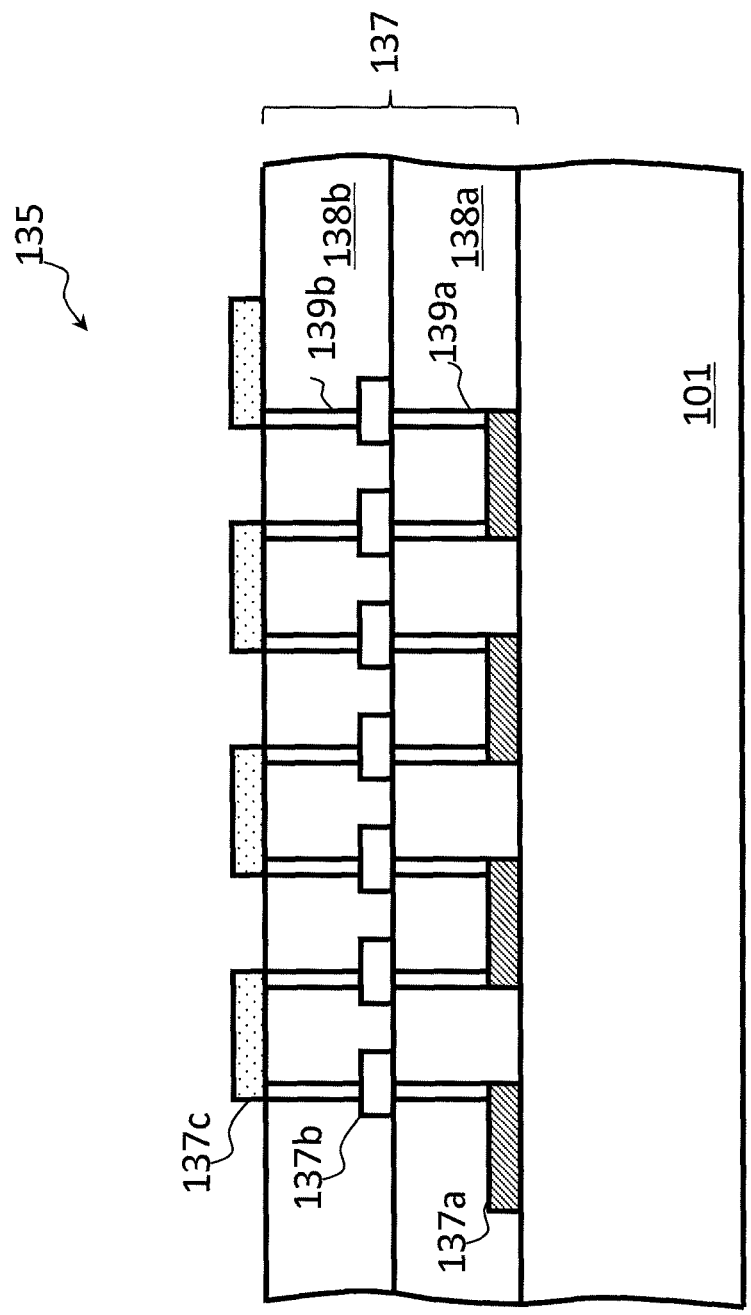
FIG. 1C is a schematic cross-sectional view of a portion of a leakage current test structure taken along a section line 1C-1C shown in FIG. 1B.

In some embodiments, the at least one portion of the leakage current test structure 135 is routed vertically and/or up and down in an interconnect structure disposed over the substrate 101. For example, FIG. 1C is a schematic cross-sectional view of a portion of the leakage current test structure 135 taken along a section line 1C-1C shown in FIG. 1B. In FIG. 1C, a portion of the conductive structure 135 is routed up and down in an interconnect structure 137 that is disposed over the substrate 101.

In some embodiments, the interconnect structure 137 can include at least two metallic layers and at least one dielectric layer disposed therebetween. For example, the interconnect structure 137 includes metallic layers 137a-137c and dielectric layers 138a-138b. The metallic layers 137a-137c can be electrically coupled with each other through via/contact plugs 139a-139b. In some embodiments, the via/contact plug 139a and the metallic layer 137b can be referred to as a dual damascene structure.

In some embodiments, the metallic layers 137a-137c and the via/contact plugs 139a-139b can each include at least one barrier material and at least one conductive material (not labeled). The at least one barrier material can include, for example, titanium, titanium-nitride, tantalum, tantalum-nitride, other barrier materials, and/or combinations thereof. The at least one conductive material can include, for example, aluminum, copper, aluminum-copper, other metallic materials, and/or combinations thereof. In some embodiments, the dielectric layers 138a-138b can each be made of at least one material, such as silicon oxide, silicon nitride, silicon oxynitride, silicon carbide, silicon oxycarbide, silicon carbon nitride, a low dielectric constant (low-k) material, an extra low-k (ELK) material, and/or any combinations thereof.

It is noted that the leakage current test structure 135 described above in conjunction with FIG. 1C is merely exemplary. The scope of the application is not limited thereto. In some embodiments, more or less metallic layers and/or dielectric layers can be disposed over the substrate 101. In some embodiments, at least one of the metallic layers 137a-137c can include a plurality of metallic segments, metallic blocks, metallic stripes, metallic plates, other metallic shape structures, and/or any combinations thereof. In some embodiments, at least one of the metallic layers 137a-137c may continuously extend over the substrate 101 and the dielectric layers 138a-138b, respectively.

Following are descriptions regarding an exemplary method of testing a leakage current between the seal ring structure 110 and the leakage current test structure 135. Referring to FIG. 1B, probe pins 132 and 142 are applied, probing the pads 130 and 140, respectively. As noted, the pads 130 and 140 are electrically coupled with the seal ring 110 and the leakage current test structure 135, respectively. A current is then applied to the probe pin 132. If any damage, distortion, crack, and/or delamination occur to the dielectric structure in the region (not labeled) between the seal ring structure 110 and the leakage current test structure 135, a leakage current may be probed by the probe pin 142 at the pad 140.

Figure 2:
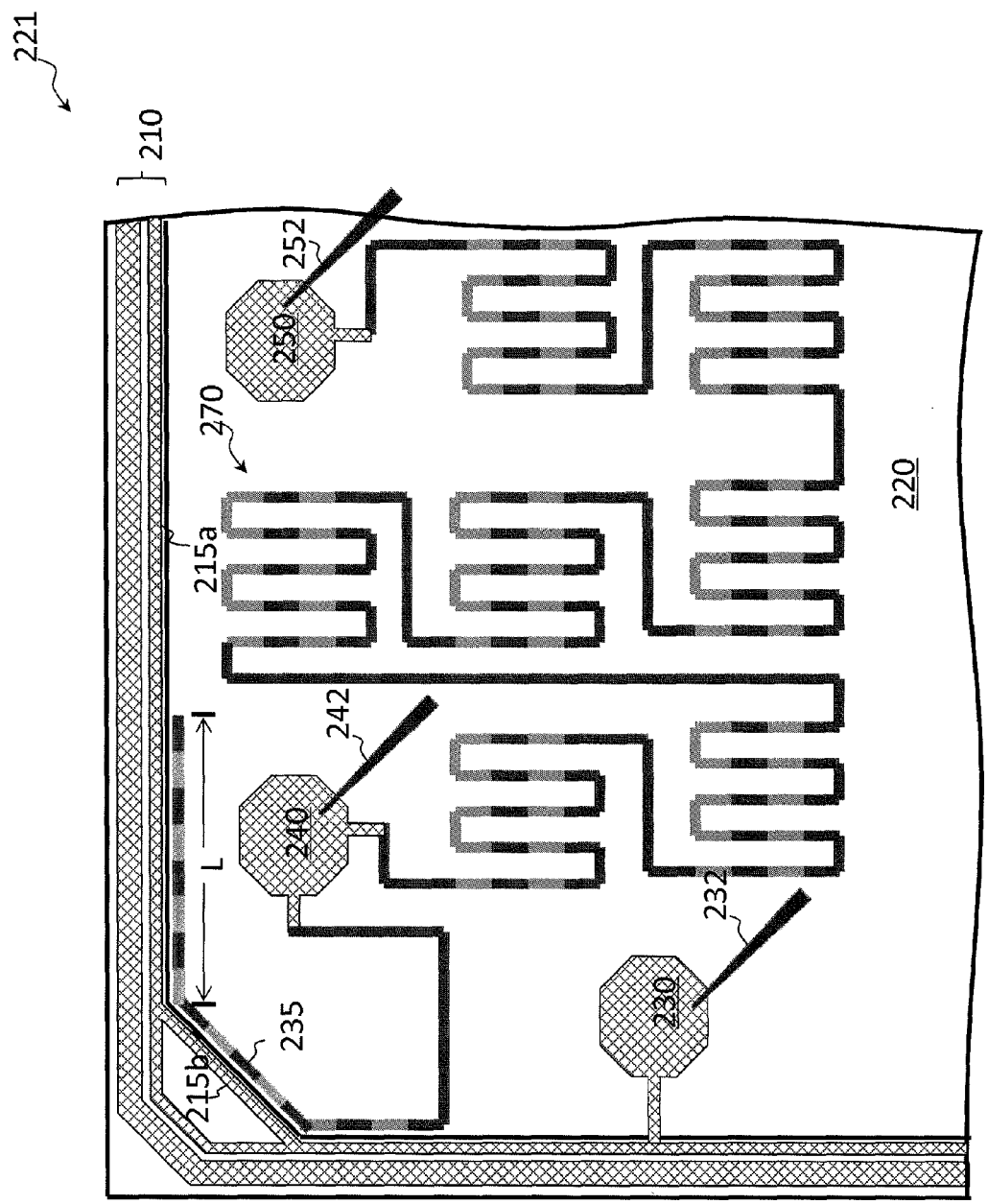
FIG. 2 illustrates a magnified corner of an exemplary integrated circuit with a daisy chain.

In some embodiments, the leakage current test structure is a portion of a daisy chain. For example, FIG. 2 illustrates a magnified corner of another exemplary integrated circuit. Items of FIG. 2 that are the same or similar items in FIG. 1B are indicated by the same reference numerals, increased by 100. In FIG. 2, a seal ring structure 210 is disposed around a circuit 220. A leakage current test structure 235 is disposed adjacent to a corner 221 of an integrated circuit. The leakage current test structure 235 is separated from the portion 215b of the seal ring structure 210 by a predetermined distance. Pads 230 and 240 are electrically coupled with the seal ring structure 210 and the leakage current test structure 235, respectively.

In some embodiments, the seal ring structure 210 includes portions 215a and 215b. The portion 215b is tilted from the portion 215b at an angle. The portion 215b of the seal ring structure 210 is disposed adjacent to the corner 221 of an integrated circuit. In some embodiments, the leakage current test structure 235 extends for a distance L along the portion 215a of the seal ring structure 210 in a parallel fashion. In some embodiments, the distance L is from about 70 μm to about 200 μm. With the extended length of the leakage current test structure 235, a leakage current resulting from damage, cracks, and/or delamination of dielectric structures in the region between the portion 215a and the leakage current test structure 235 may be probed by the pads 230 and 240.

As noted, the current test structure 235 is a portion of a daisy chain 270. The daisy chain 270 is configured to provide a continuity test at the corner 221 of the integrated circuit. The daisy chain 270 may have a routing structure that is the same as or similar to that of the interconnect structure 137 described above in conjunction with FIG. 1C.

As noted, the daisy chain 270 is configured to provide a continuity test. The daisy chain 270 can be electrically coupled with a pad 250 as shown in FIG. 2. During a continuity test, probe pins 242 and 252 can be applied, probing the pads 240 and 250, respectively. A current is then applied to the pad 240 by the probe pin 242. If the current can be detected at the pad 250 by a probe pin 252, it is assumed that the continuity of the daisy chain 270 at the corner 221 is acceptable. If the probe pin 252 does not detect the current at the pad 250, it is assumed that the continuity of the daisy chain 270 at the corner 221 is failed.

In an embodiment of this application, a method of making an integrated circuit includes forming a seal ring structure around a circuit where the seal ring structure has a first portion and a tilted portion. The first portion of the seal ring structure is substantially parallel with an edge of the circuit. The tilted portion of the seal ring structure forms an obtuse angle with the first portion. The method further includes forming a first pad which is electrically coupled with the seal ring structure. Additionally, the method includes disposing a leakage current test structure in an area enclosed by the seal ring where at least one portion of the leakage current test structure is substantially parallel with the tilted portion of the seal ring structure. Further, the method includes forming a second pad which is electrically coupled with the leakage current test structure where the leakage current test structure is configured to provide a leakage current test between the seal ring structure and the leakage current test structure.

In another embodiment of this application, a method of making an integrated circuit includes forming a seal ring structure around a circuit where the seal ring structure has a first portion and a tilted portion. The first portion of the seal ring structure is substantially parallel with an edge of the circuit and the tilted portion of the seal ring structure forms an obtuse angle with the first portion. The method further includes forming a first pad which is electrically coupled with the seal ring structure. Additionally, the method includes disposing a daisy chain within an area enclosed by the seal ring structure. Further, the method includes forming a second pad which is electrically coupled with the daisy chain, and at least one portion of the daisy chain is substantially parallel with the tilted portion of the seal ring structure.

In another embodiment, a method of making an integrated circuit includes forming a seal ring structure around a circuit where the seal ring structure has a first portion and a tilted portion. The first portion of the seal ring structure is substantially parallel with an edge of the circuit and the tilted portion of the seal ring structure forms an obtuse angle with the first portion. The method further includes forming a first pad which is electrically coupled with the seal ring structure. Additionally, the method includes disposing a daisy chain within an area enclosed by the seal ring structure. Further, the method includes forming a second pad which is electrically coupled with a first portion of the daisy chain. Furthermore, the method includes forming a third pad which is electrically coupled with a tilted portion of the daisy chain, where the daisy chain is configured to provide a continuity test, and at least one portion of the daisy chain is substantially parallel with the tilted portion of the seal ring structure.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method of making an integrated circuit comprising:
forming a seal ring structure around a circuit, wherein the seal ring structure has a first portion and a tilted portion, the first portion of the seal ring structure being substantially parallel with an edge of the circuit, the tilted portion of the seal ring structure forming an obtuse angle with the first portion;
forming a first pad which is electrically coupled with the seal ring structure;
disposing a leakage current test structure in an area enclosed by the seal ring structure, wherein at least one portion of the leakage current test structure is substantially parallel with the tilted portion of the seal ring structure; and
forming a second pad which is electrically coupled with the leakage current test structure, wherein the leakage current test structure is configured to provide a leakage current test between the seal ring structure and the leakage current test structure.

2. The method of claim 1, wherein the leakage current test structure extends along the first portion of the seal ring structure in a parallel fashion.

3. The method of claim 1, wherein the at least one portion of the leakage current test structure is separated from the tilted portion of the seal ring structure by about 3 micrometers (μm) or less.

4. The method of claim 1, further comprising routing the leakage current test structure in an interconnect structure over a substrate.

5. The method of claim 1, wherein the leakage current test structure is a portion of a daisy chain that is over a substrate.

6. The method of claim 5, further comprising forming a third pad which is electrically coupled with the daisy chain.

7. The method of claim 1, wherein the seal ring structure comprises at least one of copper, aluminum, tungsten, titanium, tantalum, nickel, or cobalt.

8. The method of claim 1, wherein the leakage current test structure is adjacent to a corner of the integrated circuit.

9. A method of making an integrated circuit comprising:
forming a seal ring structure around a circuit, wherein the seal ring structure has a first portion and a tilted portion, the first portion of the seal ring structure being substantially parallel with an edge of the circuit, the tilted portion of the seal ring structure forming an obtuse angle with the first portion;
forming a first pad which is electrically coupled with the seal ring structure;

disposing a daisy chain within an area enclosed by the seal ring structure;

forming a second pad which is electrically coupled with the daisy chain, and at least one portion of the daisy chain being substantially parallel with the tilted portion of the seal ring structure.

10. The method of claim 9, wherein the at least one portion of the daisy chain extends along the first portion of the seal ring structure.

11. The method of claim 9, wherein the at least one portion of the daisy chain is separated from the tilted portion of the seal ring structure by about 3 micrometers (μm) or less.

12. The method of claim 9, further comprising routing the daisy chain in an interconnect structure over a substrate.

13. The method of claim 9, further comprising forming a third pad which is electrically coupled with the daisy chain.

14. The method of claim 9, wherein the seal ring structure comprises at least one of copper, aluminum, tungsten, titanium, tantalum, nickel, or cobalt.

15. The method of claim 9, wherein the daisy chain is adjacent to a corner of the integrated circuit.

16. A method of making an integrated circuit comprising:
forming a seal ring structure around a circuit, wherein the seal ring structure has a first portion and a tilted portion, the first portion of the seal ring structure being substantially parallel with an edge of the circuit, the tilted portion of the seal ring structure forming an obtuse angle with the first portion;

forming a first pad which is electrically coupled with the seal ring structure;

disposing a daisy chain within an area enclosed by the seal ring structure;

forming a second pad which is electrically coupled with a first portion of the daisy chain; and forming a third pad which is electrically coupled with a tilted portion of the daisy chain, wherein the daisy chain is configured to provide a continuity test, and at least one portion of the daisy chain being substantially parallel with the tilted portion of the seal ring structure.

17. The method of claim 16, wherein the daisy chain is adjacent to a corner of the integrated circuit.

18. The method of claim 16, wherein the seal ring structure comprises at least one of copper, aluminum, tungsten, titanium, tantalum, nickel, or cobalt.

19. The method of claim 16, wherein the at least one portion of the daisy chain is separated from the tilted portion of the seal ring structure by about 3 micrometers (μm) or less.

20. The method of claim 16, further comprising routing the daisy chain in an interconnect structure over a substrate.

* * * * *